(12) United States Patent
Chang et al.

(10) Patent No.: US 10,729,042 B2
(45) Date of Patent: Jul. 28, 2020

(54) DISPLAY DEVICE

(71) Applicant: LG ELECTRONICS INC., Seoul (KR)

(72) Inventors: Myungwhun Chang, Seoul (KR); Donghyun Kim, Seoul (KR); Yanghyun Kim, Seoul (KR); Jonggon Shin, Seoul (KR); Jongjin Woo, Seoul (KR); Sangho Choi, Seoul (KR); Jinkyo Han, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 16/283,621

(22) Filed: Feb. 22, 2019

(65) Prior Publication Data

US 2020/0100401 A1 Mar. 26, 2020

Related U.S. Application Data

(60) Provisional application No. 62/734,236, filed on Sep. 20, 2018.

(51) Int. Cl.
*H05K 7/20* (2006.01)
*H05K 5/00* (2006.01)
*H05K 5/03* (2006.01)

(52) U.S. Cl.
CPC ....... *H05K 7/20972* (2013.01); *H05K 5/0017* (2013.01); *H05K 5/03* (2013.01); *H05K 7/2099* (2013.01); *H05K 7/20145* (2013.01); *H05K 7/20172* (2013.01); *H05K 7/20336* (2013.01)

(58) Field of Classification Search
CPC .............. F28D 15/0233; H05K 7/2099; H05K 7/20954
See application file for complete search history.

(56) References Cited

U.S. PATENT DOCUMENTS

| | | | | |
|---|---|---|---|---|
| 6,754,077 B2* | 6/2004 | Lo | ............................. | G06F 1/20 165/104.33 |
| 7,382,616 B2* | 6/2008 | Stefanoski | ................ | G06F 1/20 165/104.33 |
| 7,684,187 B1* | 3/2010 | Meyer, IV | .......... | F28D 15/0233 165/104.33 |

(Continued)

FOREIGN PATENT DOCUMENTS

| KR | 101340111 | 12/2013 |
|---|---|---|
| KR | 1020180036245 | 4/2018 |

OTHER PUBLICATIONS

PCT International Application No. PCT/KR2019/000617, International Search Report dated Jan. 15, 2019, 4 pages.

*Primary Examiner* — Mukundbhai G Patel
(74) *Attorney, Agent, or Firm* — Lee, Hong, Degerman, Kang & Waimey (57) ABSTRACT

Provided is a display device. The display device includes a display panel and at least one cooler configured to dissipate heat of the display panel. The at least one cooler includes a vapor chamber including a high temperature heated by the display panel and a low temperature connected to the high temperature portion through a connection portion and spaced apart from the display panel, a fan spaced apart from the vapor chamber to blow air toward the vapor chamber, and an air guide configured to guide the air blown from the fan to the low temperature portion.

22 Claims, 5 Drawing Sheets

(56) References Cited

U.S. PATENT DOCUMENTS

| | | | |
|---|---|---|---|
| 8,857,502 B2* | 10/2014 | Huang | F28D 15/046 165/104.26 |
| 8,964,383 B2 | 2/2015 | Degner et al. | |
| 8,971,037 B2* | 3/2015 | Kang | H01L 23/427 361/679.46 |
| 8,976,528 B2 | 3/2015 | Degner et al. | |
| 9,282,656 B2 | 3/2016 | Degner et al. | |
| 9,423,841 B2 | 8/2016 | Degner et al. | |
| 9,907,201 B2 | 2/2018 | Degner et al. | |
| 9,946,316 B2 | 4/2018 | Degner et al. | |
| 2006/0139887 A1* | 6/2006 | Kameda | H01L 23/427 361/704 |
| 2012/0160452 A1 | 6/2012 | Kang | |
| 2012/0236499 A1 | 9/2012 | Murayama et al. | |
| 2013/0286298 A1 | 10/2013 | Sakuma et al. | |
| 2013/0327507 A1 | 12/2013 | Degner et al. | |
| 2013/0329357 A1 | 12/2013 | Degner et al. | |
| 2013/0329368 A1 | 12/2013 | Degner et al. | |
| 2015/0163960 A1 | 6/2015 | Degner et al. | |
| 2016/0147269 A1 | 5/2016 | Degner et al. | |
| 2016/0357231 A1 | 12/2016 | Degner et al. | |
| 2018/0184545 A1 | 6/2018 | Degner et al. | |

* cited by examiner

DISPLAY DEVICE

CROSS-REFERENCE TO RELATED APPLICATIONS

Pursuant to 35 U.S.C. § 119(e), this application claims the benefit of U.S. Provisional Patent Application No. 62/734,236, filed on Sep. 20, 2018, the contents of which are hereby incorporated by reference herein in its entirety.

BACKGROUND

1. Field of the Disclosure

The present disclosure relates to a display device.

2. Discussion of the Related Art

As our information society develops, needs for diverse forms of display devices are increasing. Accordingly, research has been carried out on various display devices such as liquid crystal display devices (LCDs), plasma display panels (PDPs), electro luminescent displays (ELDs), and vacuum fluorescent displays (VFDs).

Such a display device may include a circuit board on which a heat generation element such as a CPU is mounted, and a heat pipe and a fan may be mounted to dissipate the heat generated by the heat generation element or the circuit board. The display device may include a heat pipe having one end disposed in the vicinity of the heat generation element and the fan disposed on the other end of the heat pipe to forcibly discharge heat moved from one end to the other end of the heat pipe to the outside.

In the display device provided with the heat pipe, thermal diffusion may be intensively generated in one side portion of the heat pipe, and the heat radiation direction is restricted in a single direction (i.e., a longitudinal direction of the heat pipe).

When using a sheet-shaped vapor chamber in which the heat transfer direction is multi-directional, the display device may dissipate heat faster than in the case of the heat pipe.

As described above, an example of an electronic device using the vapor chamber is disclosed in Korean Patent Publication No. 10-2015-0127473 (Published on Nov. 17, 2015), and the vapor chamber is formed in a plate shape or a sheet shape to spread heat as widely as possible, and a portion of the vapor chamber is disposed to extend up to a position that is close to an inner circumferential surface of a main body. The vapor chamber may be provided with an interference avoiding hole capable of avoiding an interference of components mounted on the circuit board.

SUMMARY

Embodiments provide a display device in which a flow rate of a refrigerant accommodated in a vapor chamber increases to allow the vapor chamber to more quickly dissipate heat of a display panel.

In one embodiment, a display device includes: a display panel; and at least one cooler configured to dissipate heat of the display panel, wherein the at least one cooler includes: a vapor chamber including a high temperature portion heated by the display panel and a low temperature portion connected to the high temperature portion through a connection portion and spaced apart from the display panel; a fan spaced apart from the vapor chamber to blow air toward the vapor chamber; and an air guide configured to guide the air blown from the fan to the low temperature portion.

The display panel may include: a case; a circuit board which is disposed inside the case and on which at least one heat generation element is installed; and a back cover configured to protect the circuit board.

The circuit board may include a vapor chamber facing surface facing the vapor chamber. A through-hole through which the vapor chamber passes may be defined in the back cover.

The air guide may include: an inner guide disposed between the fan and the high temperature portion to guide the air blown from the fan to the low temperature portion; and an outer guide providing passages between the inner guide and the outer guide and between the vapor chamber and the outer guide.

The high temperature portion may face one surface of the inner guide, and the fan may face the other surface of the inner guide.

The inner guide may have a size greater than that of each of the fan and the high temperature portion. An outer circumference of the inner guide may face the connection portion.

An inner guide coupling portion configured to couple the inner guide to the high temperature portion may be disposed on each of the high temperature portion and the inner guide. The inner guide coupling portion may have a width by which the inner guide is spaced apart from the high temperature portion.

A second coupling portion configured to couple the fan to the inner guide may be disposed on at least one of the inner guide and the fan, and the second coupling portion may have a width by which the fan is spaced apart from the inner guide.

The outer guide may include: a first body having an air suction hole, coupled to the fan, and spaced apart from each other the inner guide and the low temperature portion in a forward and backward direction; and a second body extending from the first body to surround an outer circumference of the low temperature portion.

The outer circumference of the low temperature portion may face an inner circumference of the second body in a radial direction and be spaced apart from the inner circumference of the second body.

The second body may be spaced apart from the display panel. The second body may be gradually expanded as being closer to display panel 1.

The display device may further include a barrier, which is configured to surround an outer circumference of the at least one cooler and spaced apart from the at least one cooler, in the vicinity of the at least one cooler.

The details of one or more embodiments are set forth in the accompanying drawings and the description below. Other features will be apparent from the description and drawings, and from the claims.

According to the embodiment, since the air flowing by the fan is concentrated to the low temperature portion of the vapor chamber to quickly cool the low temperature portion of the vapor chamber, the refrigerant within the vapor chamber may more quickly move, and the high temperature portion of the vapor chamber may be quickly cooled.

In addition, since the outer guide is disposed outside the inner guide to surround the outer circumference of the inner guide, the inner guide may be protected by the outer guide.

Also, since the inner guide is covered by the outer guide, the outer appearance of the cooler may be elegant.

Also, since the air blown from the fan is blocked by the inner guide and thus does not flow to the high temperature portion of the vapor chamber, the difference in temperature between the high temperature portion and the low temperature portion may more increase. Thus, when compared to the case in which the air blown from the fan flows to the high temperature portion, the refrigerant may more quickly flow.

DETAILED DESCRIPTION OF THE PREFERRED EMBODIMENTS

Hereinafter, detailed embodiments of the present invention will be described in detail with reference to the accompanying drawings.

Figure 1:
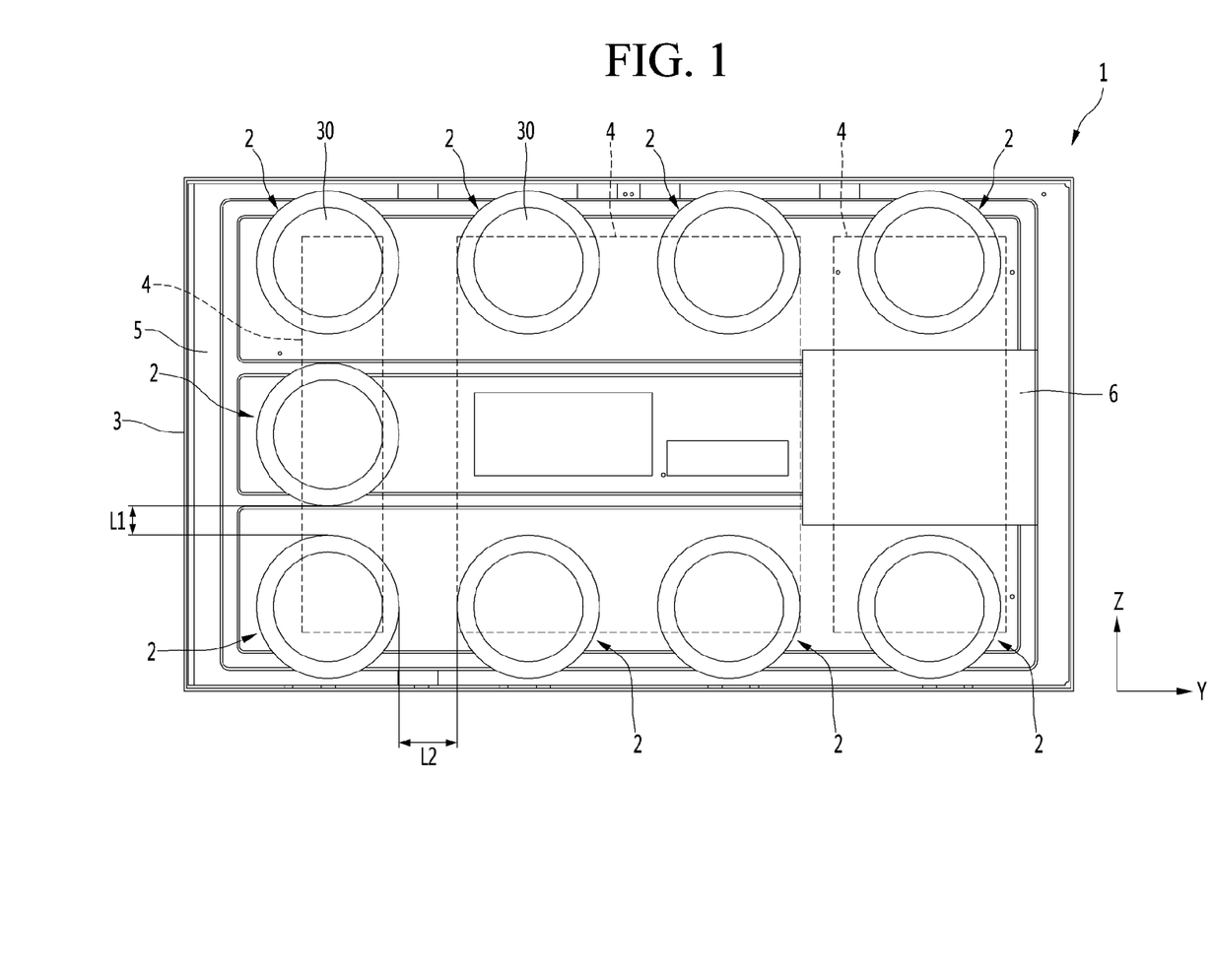
FIG. 1 is a rear view of a display device according to an embodiment.

FIG. 1 is a rear view of a display device according to an embodiment.

A display device includes a display panel 1 and at least one cooler 2 for dissipating heat of the display panel 1.

The display panel 1 may include a case 3 defining an outer edge thereof, a display module (not shown) disposed inside the case 3 to display an image such as an LCD, a PDP, an OLED, and the like, a circuit board 4 which is disposed inside the case 3 and on which at least one heat generation element such as a CPU is installed, and a back cover 5 for protecting the circuit board 4.

The display module may have an outer circumference that is disposed to be surrounded by the case 3 and display an image in a front direction. The display module may include a display element displaying the image and a light source emitting light to the display element.

The circuit board 4 may be disposed behind the display module and electrically connected to the display module.

The back cover 5 may be disposed behind the circuit board 4 to cover and protect the circuit board 4 at the rear side of the circuit board 4. The back cover 5 may be a heat dissipation plate contacting the circuit board 4. In this case, the back cover 5 may be disposed to thermally contact the circuit board 4.

The display device may further include a power supply unit (PSU) 6 supplying power to the display panel 1.

A single cooler 2 or a plurality of coolers 2 may be installed on the display panel 1.

When the plurality of coolers 2 are installed on the display panel 1, the plurality of coolers 2 may be installed to be spaced apart from each other on the display panel 1. The plurality of coolers 2 may one-to-one correspond to the circuit board 4. Alternatively, the number of coolers 2 may be larger than that of circuit boards 4. In the display device, two or four coolers 2 disposed to be spaced apart from each other may cool the single circuit board 4.

The plurality of coolers 2 may be mounted to be spaced apart from each other on a rear surface of the display panel 1. Here, spaced distances between the adjacent coolers may be the same or different from each other. A spaced distance L1 between a first cooler and a second cooler of the plurality of coolers 2 may be less than that L2 between the first cooler and a third cooler of the plurality of coolers 2.

The plurality of coolers 2 may be spaced apart from each other in a vertical direction Z and a horizontal direction Y. In the plurality of coolers 2, which are adjacent to each other, the vertically spaced distance L1 between the plurality of coolers may be less than the horizontally spaced distance L2 between the plurality of coolers 2.

In the cooler 2, the refrigerant within a vapor chamber may be circulated through the high temperature portion and the low temperature portion to cool the high temperature portion. Alternatively, the cooler 2 may be an air cooling-type vapor chamber assembly that is capable of cooling the low temperature portion in an air cooling manner using the fan.

Figure 2:
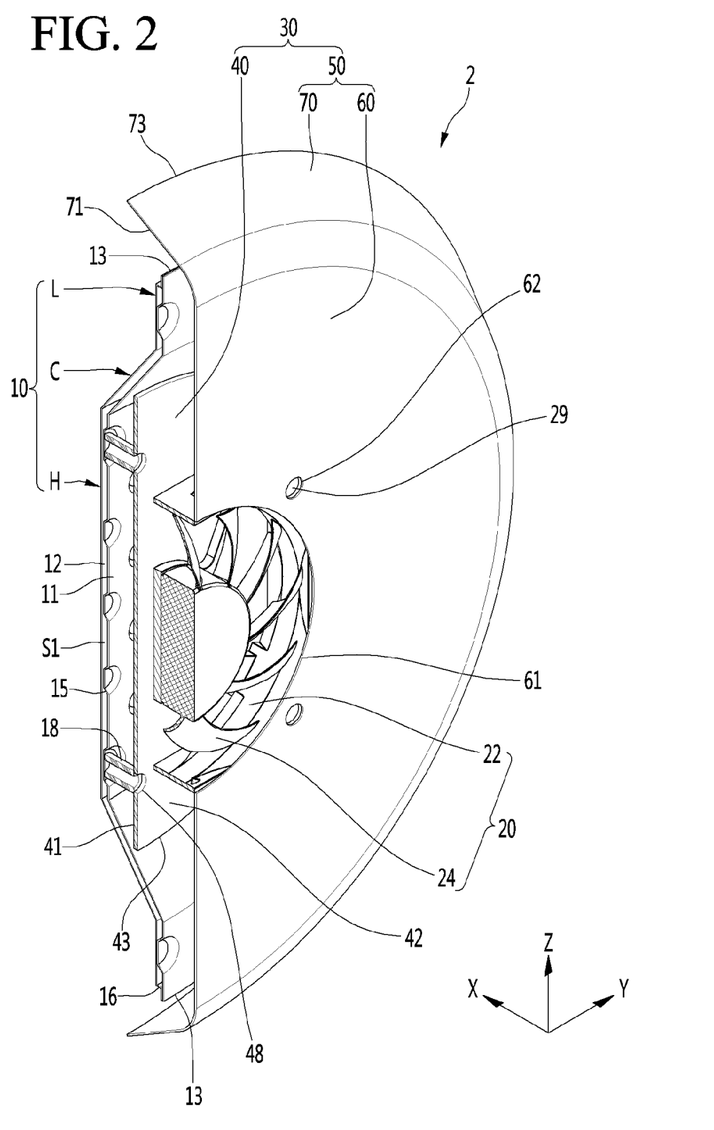
FIG. 2 is a partially cutaway perspective view of a cooler illustrated in FIG. 1.
Figure 3:
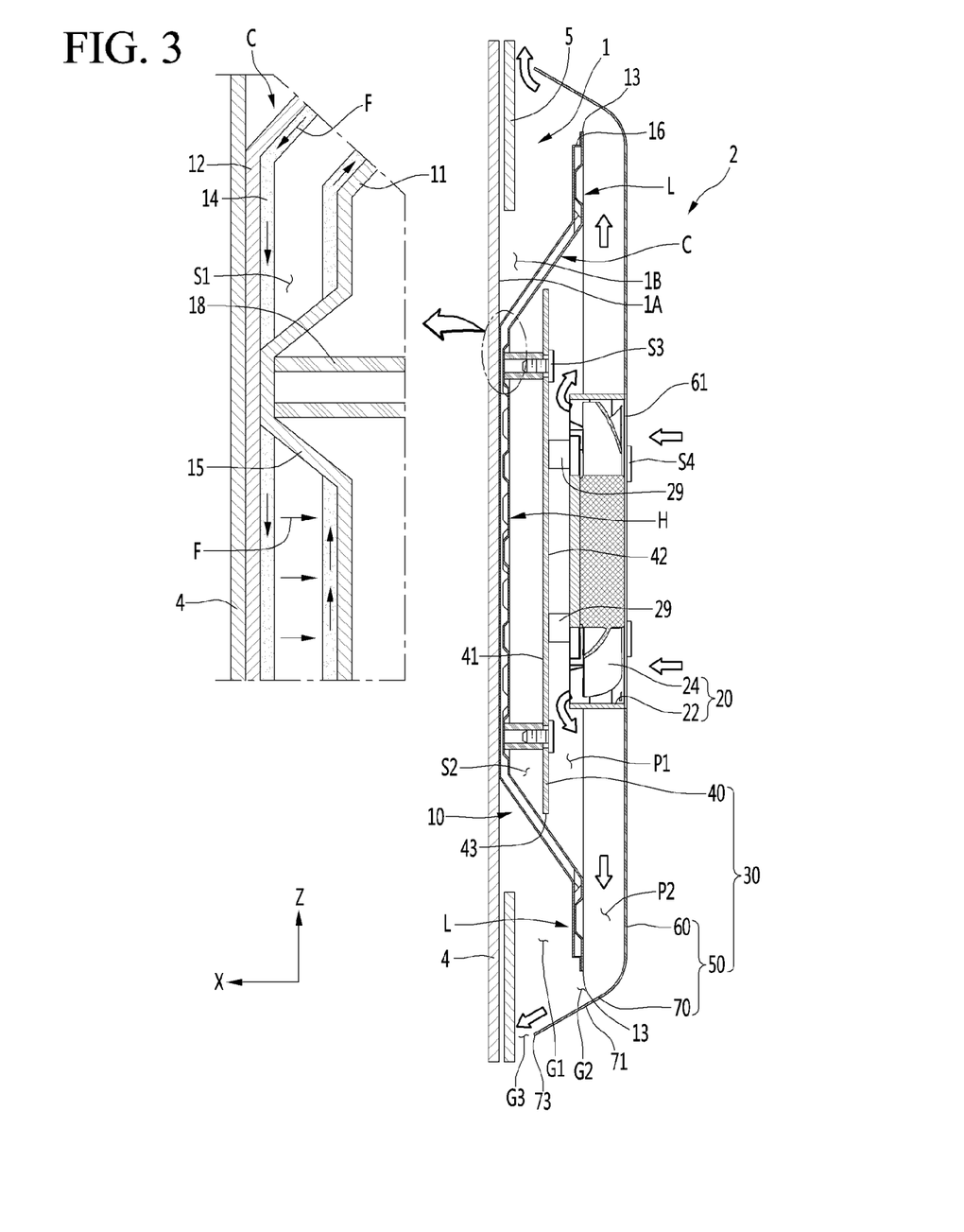
FIG. 3 is a cross-sectional view of the cooler illustrated in FIG. 1.
Figure 4:
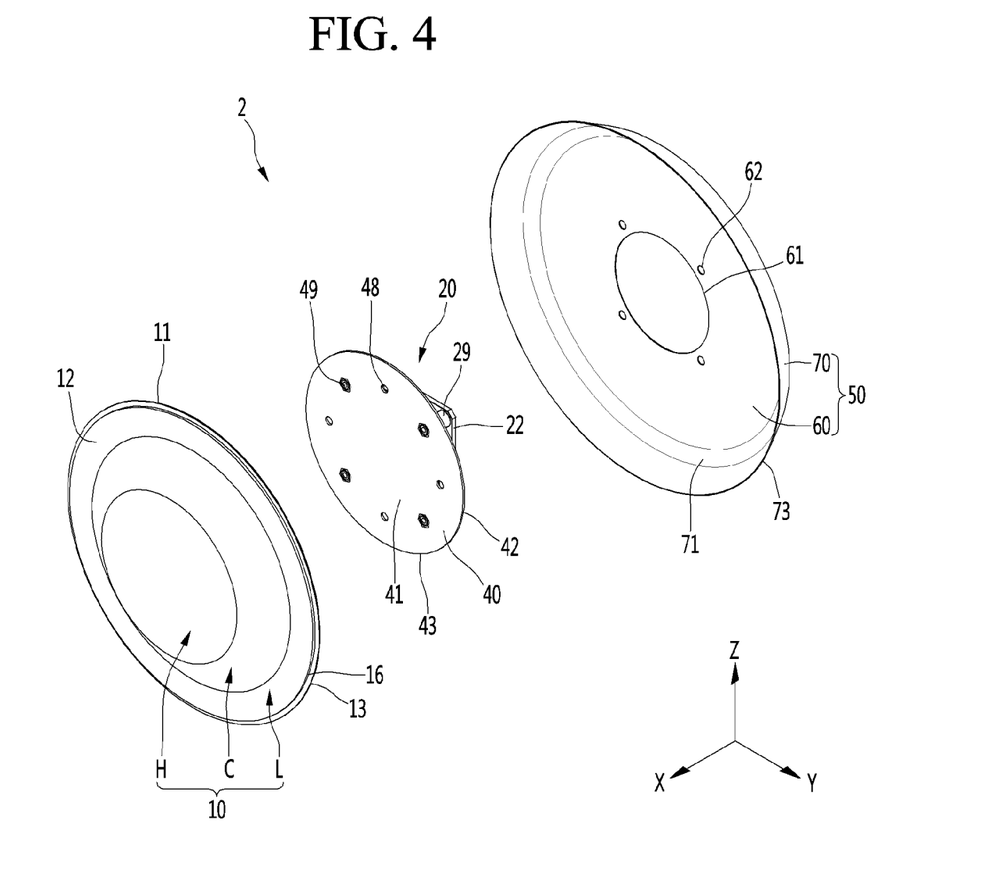
FIG. 4 is an exploded perspective view of the cooler illustrated in FIG. 1.

FIG. 2 is a partially cutaway perspective view of the cooler illustrated in FIG. 1, FIG. 3 is a cross-sectional view of the cooler illustrated in FIG. 1, and FIG. 4 is an exploded perspective view of the cooler illustrated in FIG. 1.

The cooler 2 includes a vapor chamber 10, a fan 20, and an air guide 30.

The vapor chamber 10 may include a high temperature portion H heated by the display panel 1, a low temperature portion L spaced apart from the display panel 1, and a connection portion C connecting the high temperature portion H to the low temperature portion L.

One of the heat generation element, the circuit board 4, and the back cover 5, which constitute the display panel 1, may include a vapor chamber facing surface 1A (see FIG. 3) facing the vapor chamber 10. The vapor chamber facing surface 1A may face the vapor chamber 10 in a forward and backward direction X.

The high temperature portion H may be disposed to thermally contact the display panel 1, and thus, heat of the display panel 1 may be transferred to the high temperature portion H in a conductive manner. The high temperature portion H may be an evaporation unit in which a refrigerant is evaporated by the heat transferred from the display panel 1.

When the high temperature portion H thermally contacts the rear surface of the circuit board 4, the vapor chamber facing surface 1A may be a surface of the circuit board 4, which faces the vapor chamber 10. When the high temperature portion H thermally contacts the rear surface of the circuit board 4, the vapor chamber 10, particularly, the high temperature portion H may pass through the back cover 5 to define a through-hole 1B. Thus, a through-hole through which the vapor chamber 10, particularly, the high temperature portion H passes may be defined in the back cover 5.

The cooler 2 may have an overall size greater than a size of the through-hole 1B of the back cover 5, and the through-hole 1B of the back cover 5 may be concealed by the cooler and thus be invisible.

The through-hole 1B may have a size less than that of the vapor chamber 10. The through-hole 1B may have a size less than that of an outer guide 50 that will be described later.

The high temperature portion H may directly contact the vapor chamber facing surface 1A of the display panel 1 or may contact the vapor chamber facing surface 1A with an adhesive or a thermal pad having high thermal conductivity therebetween. The high temperature portion H may be a display panel contact portion that thermally contacts the display panel 1 to absorb the heat of the display panel 1.

The low temperature portion L may be a condensing unit in which the refrigerant is condensed by air flowing by the fan 20. The refrigerant moving to the low temperature portion L through the connection portion C after being evaporated in the high temperature H may be condensed in the low temperature portion L.

The low temperature portion L may not directly contact the display panel 1 but be spaced apart from the vapor chamber facing surface 1A of the display panel 1. The low temperature portion L may be spaced apart from the vapor chamber facing surface 1A in the forward and backward direction. A gap G (see FIG. 3) may be defined between the low temperature portion L and the vapor chamber facing surface 1A. The low temperature portion L may have a height difference in the forward and backward direction with respect to the high temperature portion H by the connection portion C.

The low temperature portion L may have an inner diameter greater than an outer diameter of the high temperature portion H. A width of the low temperature portion L in a radial direction may have a length so that the low temperature portion L has an area greater than that of the high temperature portion H.

The connection portion C may have a shape so that the high temperature portion H and the low temperature portion L have a height difference in the forward and backward direction therebetween or may have a three-dimensional shape. The connection portion C may connect an outer circumference of the high temperature portion H to an inner circumference of the low temperature portion L. The connection portion C may have a shape that gradually decreases in size from the low temperature portion L to the high temperature portion H.

The high temperature portion H may have a circular plate shape, and the low temperature portion L may have a hollow circular plate shape or a ring shape. The connection portion C may have a cylindrical shape that gradually decreases in diameter in a direction that is closer to the high temperature portion H. An inner guide accommodation space in which an inner guide 40 that will be described later is accommodated may be defined inside the connection portion C.

The vapor chamber 10 may include a pair of heat transfer members 11 and 12. The pair of heat transfer members 11 and 12 may define a sealed space S1 through which the refrigerant F moves by the heat. One 11 of the pair of heat transfer members 11 and 12 may include a heat dissipation surface through which heat is dissipated by the air flowing by the fan 20. The other 12 of the pair of heat transfer members 11 and 12 may include a heat absorption surface which faces the vapor chamber facing surface 1A and through which heat of the display panel 1 is absorbed.

The pair of heat transfer members 11 and 12 may be at least one member selected from the group of metals having high thermal conductivity such as copper, aluminum, an aluminum alloy, nickel, a nickel alloy, titanium, magnesium, and the like. An outer circumference of one heat transfer member 11 of the pair of heat transfer members 11 and 12 may be an outer circumference 13 of the vapor chamber 10, and the other heat transfer member 12 of the pair of heat transfer members 11 and 12 may be an outer body 16 that is bonded to the one heat transfer member 11 through welding.

A wick 14 (see FIG. 3) through which the liquid refrigerant is guided by a capillary phenomenon may be disposed in the vapor chamber 10. The wick 14 may be disposed on an inner surface of each of the pair of heat transfer members 11 and 12, The wick 14 may be disposed on a surface facing the other heat transfer member 12 of both surfaces of the one heat transfer member 11 of the pair of heat transfer members 11 and 12 or may be disposed on a surface facing the one heat transfer member 11 of both surfaces of the other heat transfer member 12 of the pair of heat transfer members 11 and 12.

A spacer 15 for spacing the pair of heat transfer members 11 and 12 apart from each other may be disposed in the vapor chamber 10. The spacer 15 may be provided as a protrusion that protrudes from the one heat transfer member 11 to the other heat transfer member 12 of the pair of heat transfer members 11 and 12 to contact the other heat transfer member 12. A boss accommodation space into which a front end of a boss 18 (that will be described later) of the high temperature portion H is inserted and accommodated may be defined in the protrusion.

The fan 20 may be disposed to be spaced apart from the vapor chamber 10. The fan 20 may blow air toward the vapor chamber 10. An example of the fan 20 may include an axial-flow fan that suctions air in an axial direction to blow the air in the axial direction. Another example of the fan 20 may include a centrifugal fan that suctions air in an axial direction to blow the air in a centrifugal direction.

The fan 20 may include a fan housing 22 guiding air and a fan motor 24 disposed in the fan housing 22 to blow the air. The fan motor 24 may be accommodated in the fan housing 22.

When the fan 20 is the axial-flow fan, the fan 20 may be disposed to suction air from a rear side thereof and blow the air forward. Here, the air blown from the fan 20 may flow to an inner guide 40.

The air guide 30 may guide the air blown from the fan 20 to the low temperature par L. The air guide 30 may guide the air so that the air is concentrated into the low temperature portion L without flowing to the high temperature portion H.

The air guide 30 may include the inner guide 40 and the outer guide 50.

The inner guide 40 may guide the air blown from the fan 20 to the low temperature par L. The inner guide 40 may be disposed between the fan 20 and the high temperature portion H. The inner guide 40 may be an inner barrier that prevents the air blown from the fan 20 from directly flowing to the high temperature portion H.

The inner guide 40 may have a size greater than that of the fan 20. The inner guide 40 may have a size greater than that of the fan housing 22. The inner guide 40 may have a size greater than that of the high temperature portion H.

The inner guide 40 may have a plate shape, particularly, a circular plate shape. The inner guide 40 may include one surface 41 facing the high temperature portion H in the forward and backward direction X and the other surface 42 facing the fan 20 in the forward and backward direction X.

The inner guide 40 may be disposed between the fan 20 and the high temperature portion H. The high temperature portion H may face the one surface 41 of the inner guide 40, and the fan 20 may face the other surface 42 of the inner guide 40.

The inner guide 40 may be disposed in the connection portion C and accommodated in the inner guide accommodation space S2 defined in the connection portion C. In this case, the connection portion C may surround the outer circumference 43 of the inner guide 40.

The inner guide 40 may have an outer diameter greater than that of the high temperature portion H and also greater than a minimum inner diameter of the connection portion C. The outer diameter of the inner guide 40 may be less than a maximum inner diameter of the connection portion C.

If the inner guide 40 is not disposed between the fan 40 and the high temperature portion H, the air blown from the fan 20 may collide with the one surface of the high temperature portion L and then be spread in a peripheral direction. In this case, the air blown from the fan 20 may contact/be heat-exchanged with the high temperature portion L for a short time and also directly air-cooled by the air blown from the fan 20. Thus, a difference in temperature between the high temperature portion H and the low temperature portion L may be small.

In the vapor chamber 10, when the difference in temperature between the high temperature portion H and the low temperature portion L is large, the refrigerant F may be quickly circulated through the high temperature portion H and the low temperature portion L to cool the high temperature portion H. If the different in temperature between the high temperature portion H and the low temperature portion L, a flow rate of the refrigerant F may be slow to deteriorate heat dissipation performance of the vapor chamber 10.

On the other hand, according to this embodiment, the air blown from the fan 20 may be concentrated into the low temperature portion L to concentratedly air-cool the low temperature portion L. As a result, the difference in temperature between the high temperature portion H and the low temperature portion L may be large. Also, since the refrigerant is quickly circulated through the high temperature portion H and the low temperature portion L, the heat dissipation performance of the vapor chamber 10 may be improved.

The outer guide 50 may guide the air, of which the flow direction is changed into the peripheral direction after colliding with the inner guide 40, to the low temperature portion L. The outer guide 50 may guide the air so that the air, which is switched in flow direction to the rear direction of the inner guide 40 after colliding with the inner guide 40, flows to the low temperature portion L.

The outer guide 50 may provide passages P1 and P2 together with the inner guide 40 and the vapor chamber 10 therebetween.

An inner passage P1 through which the air spread in the peripheral direction after colliding with the inner guide 40 passes may be provided between the outer guide 50 and the inner guide 40. Also, an outer passage P2 through the air passing through the inner passage P1 is guided to the rear surface of the low temperature portion L may be provided between the outer guide 50 and the vapor chamber 10.

The outer passages P2 may be provided between the outer guide 50 and the connection portion C and between the outer guide 50 and the low temperature portion L, respectively.

The inner guide 40 may have a size greater than that of each of the fan 20 and the high temperature portion L, and the outer circumference of the inner guide 40 may face the connection portion C.

The outer circumference 43 of the inner guide may face the inner circumference of the connection portion C, and a minimum gap may be provided between the outer circumference 43 of the inner guide 40 and the inner circumference of the connection portion C.

When the outer circumference 43 of the inner guide 40 faces the inner circumference of the connection portion C, the air may flow over the inner circumference of the connection portion C to flow to the outer passage P2.

The air spread in the peripheral direction after colliding with the inner guide 40 may be heat-exchanged with the connection portion C while flowing along the inner circumference of the connection portion C. Then, the air may be heat-exchanged with the low temperature portion L while being guided along the rear surface of the low temperature portion L.

As described above, when the air blown from the fan 20 is sequentially guided along the inner circumference of the connection portion C and the rear surface of the low temperature portion L, the contact/heat-exchange time between the air and the vapor chamber 10 may increase. Here, the refrigerant may pass the low temperature portion L and the connection portion C to dissipate heat.

An air guide 30 may provide an "S"-shaped passage in a radial direction within the cooler 2. The "S"-shaped passage may be provided by the vapor chamber 10 and the air guide 30.

For this, a distance between the vapor chamber facing surface 1A and the low temperature portion L may be greater than that between the vapor chamber facing surface 1A and the inner guide 40 and also be greater than between the vapor chamber facing surface 1A and a front end 73 of the outer guide 50. That is, each of the inner guide 40 and the outer guide 50 may be closer to the vapor chamber facing surface 1A than the low temperature portion L. The cooler 2 may have the "S"-shaped passage by a position relationship between the front end 73 of the outer guide 50, the low temperature portion L, and the inner guide 40.

An inner guide coupling portions 18 and 48 coupling the inner guide 40 to the high temperature portion H may be provided on the high temperature portion H and the inner guide 40, respectively.

Each of the inner guide coupling portions 18 and 48 may include a high temperature portion boss 18 having a width by which the inner guide 40 is spaced apart from the high temperature portion H. The high temperature portion boss 18 may be disposed to protrude from the high temperature portion H. The high temperature portion boss 18 may serve as a spacer for spacing the inner guide 40 apart from the high temperature portion H.

Each of the inner guide coupling portions 18 and 48 may include a coupling hole 48 defined in the inner guide 40 to correspond to the high temperature portion boss 18. The inner guide 40 may be fixed to the high temperature portion H by a coupling member S3 such as a screw, which is coupled to the coupling hole 48 and the high temperature portion boss 18.

At least one of the inner guide 40 and the fan 20 may include fan coupling portions 29 and 49 coupling the fan 20 to the inner guide 40.

Each of the fan coupling portions 29 and 49 may include a coupling boss 29 spacing the fan 20 apart from the inner guide 40. The fan coupling portions 29 and 49 may include the coupling boss 29 protruding from one of the fan 20 and the inner guide 40 and a coupling hole 49 defined in the other 40 of the fan 20 and the inner guide 40 to correspond to the coupling boss 29.

The coupling boss 29 may be disposed on the fan 20. Also, the coupling boss 29 may be disposed on the fan housing 22 of the fan housing 22 and the fan motor 24.

The fan 20 may be fixed to the inner guide 40 by a coupling member S4 such as a screw, which is coupled to the coupling boss 29 and the coupling hole 49.

The outer guide 50 may have a three-dimensional shape. The outer guide 50 may include a first body 60 and a second body 70.

An air suction hole 61 may be defined in the first body 60. The first body 60 may be coupled to the fan 20. The first body 60 may be spaced apart from each of the inner guide 40 and the low temperature portion L in the forward and backward direction X.

The first body 60 may be coupled to the fan 20 by the coupling member S4 such as the screw. An outer coupling hole 62 coupled to the fan 20 by the coupling member S4 such as the screw may be defined in the vicinity of the air suction hole 61.

The outer coupling hole 62 may be defined in a position corresponding to the coupling boss 29 of the fan 20. The coupling member S4 such as the screw may be coupled to the outer coupling hole 62 and the coupling boss 29 to couple the first body 60 to the fan 20.

The second body 70 may extend from the first body 60 to surround the outer circumference 13 of the low temperature portion L. The outer circumference 13 of the low temperature portion L may face an inner circumference 71 of the second body 70. The outer circumference 13 of the low temperature portion L may be spaced apart from the inner circumference 71 of the second body 70, and a gap G2 (an inner gap) through which the air passes may be defined between the outer circumference 13 of the low temperature portion L and the inner circumference 71 of the second body 70.

The second body 70 may be spaced apart from the display panel 1. The second body may be gradually expanded as being closer to display panel 1. The second body 70 may have a shape that is gradually expanded in the forward and backward direction. A front end 73 of the second body 70 may be spaced apart from the rear surface of the display panel 1. A gap G3 (an outer gap) through which air passes may be defined between the front end 73 of the second body 70 and the rear surface of the display panel 1.

Figure 5:
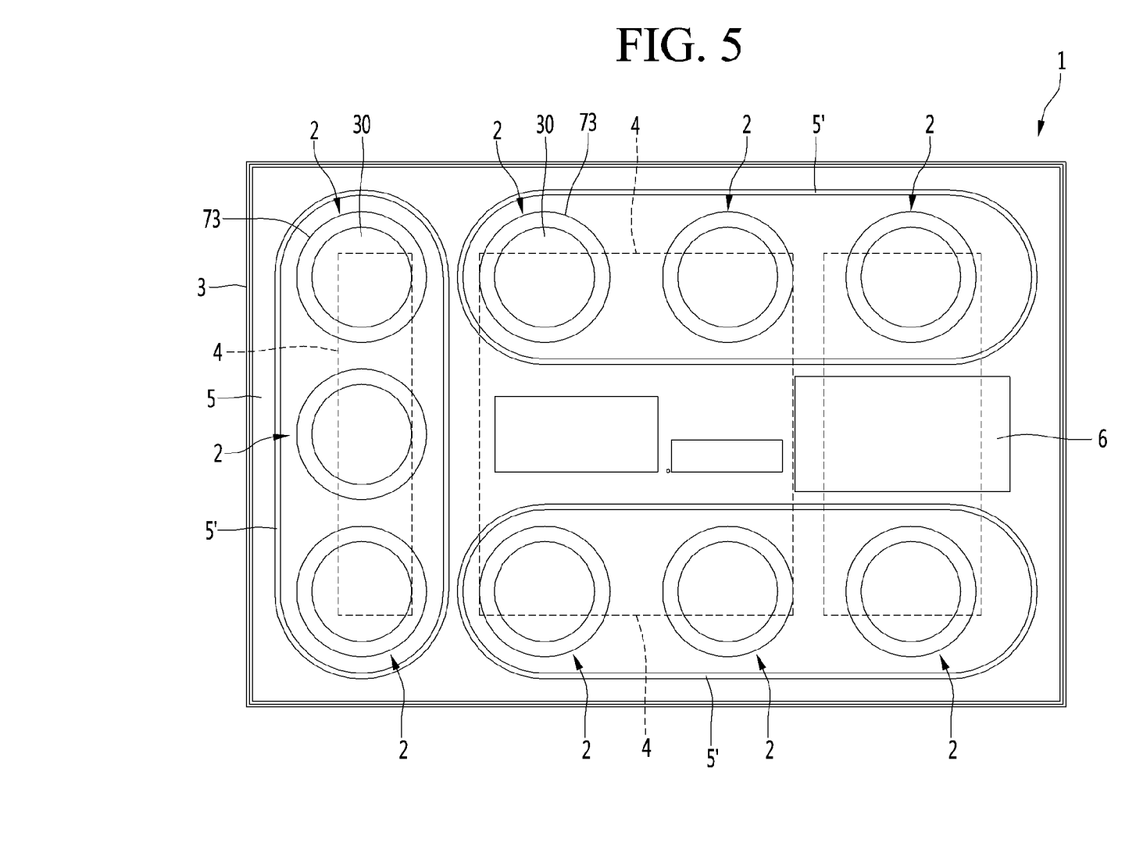
FIG. 5 is a rear view of a display device according to another embodiment.

FIG. 5 is a rear view of a display device according to another embodiment.

In this embodiment, a barrier 5' surrounding an outer circumference of a cooler 2 may be further provided in the vicinity of the at least one cooler 2. Other configurations and operations except for the barrier 5' are the same as those according to the foregoing embodiment, and therefore, the same reference numerals are used, and detailed description thereof will be omitted.

The barrier 5' may have a shape and width that are capable of minimizing foreign substances such as dusts and the like from being permeated into the cooler 2 or a display panel 1 without interrupting a flow of air discharged from the cooler 2.

The barrier 5' may be disposed to protrude from a rear surface of a back cover 5. Here, the barrier 5' may protrude backward from the back cover 5 or be coupled to the back cover 5 by using an adhesive or a hook after being separately manufactured with respect to the back cover 5.

The barrier 5' may one-to-one correspond to the cooler 2. Alternatively, the number of barrier 5' may be less than that of coolers 2.

One barrier 5' may be disposed to surround outer circumferences of the plurality of coolers 2 at the same time. The barrier 5' may have a close loop cross-sectional shape. An outer circumferential surface of the cooler 2 may face an inner circumferential surface of the barrier 5' in a vertical direction Z or horizontal direction Y.

The barrier 5' may have a predetermined depth in a forward and backward direction X. The length of the barrier 5 in the forward and backward direction X may be greater than that of a gap defined between a front end 73 of an outer guide 50 and a rear surface of the display panel 1 in the forward and backward direction X.

In this case, the gap between the front end 73 of the outer guide 50 and the rear surface of the display panel 1 may be covered to be concealed by the barrier 5' to realize an elegant outer appearance of the display device.

The above-disclosed subject matter is to be considered illustrative, and not restrictive, and the appended claims are intended to cover all such modifications, enhancements, and other embodiments, which fall within the scope of the present disclosure.

Thus, the embodiment of the present disclosure is to be considered illustrative, and not restrictive.

Therefore, the scope of the present disclosure is defined not by the detailed description of the invention but by the appended claims, and all differences within the scope will be construed as being included in the present disclosure.

What is claimed is:

1. A display device comprising:
a display panel; and
at least one cooler configured to dissipate heat of the display panel,
wherein the at least one cooler comprises:
a vapor chamber comprising a high temperature portion to be heated by the display panel and a low temperature portion connected to the high temperature portion through a connection portion and spaced apart from the display panel;
a fan spaced apart from the vapor chamber to blow air toward the vapor chamber; and
an air guide configured to guide the air blown from the fan to the low temperature portion,
wherein the air guide comprises:
an inner guide disposed between the fan and the high temperature portion to guide the air blown from the fan to the low temperature portion; and
an outer guide providing passages between the inner guide and the outer guide and between the vapor chamber and the outer guide,
wherein the high temperature portion faces a first surface of the inner guide,
wherein the fan faces a second surface of the inner guide opposite the first surface, and
wherein an inner guide coupling portion configured to couple the inner guide to the high temperature portion is disposed on each of the high temperature portion and the inner guide.

2. The display device according to claim 1, wherein:
the fan is an axial-flow fan; and
the fan comprises:
a fan housing to guide air; and
a fan motor disposed in the fan housing to blow the air toward the second surface of the inner guide.

3. The display device according to claim 1, wherein:
the inner guide has a size greater than that of each of the fan and the high temperature portion; and
an outer circumference of the inner guide faces the connection portion.

4. The display device according to claim 3, wherein:
the connection portion connects an outer circumference of the high temperature portion to an inner circumference of the low temperature portion; and
the connection portion has a shape that gradually decreases in size leading from the low temperature portion to the high temperature portion.

5. The display device according to claim 1, wherein:
the inner guide coupling portion has a width by which the inner guide is spaced apart from the high temperature portion.

6. The display device according to claim 1, wherein:
a coupling portion configured to couple the fan to the inner guide is disposed on at least one of the inner guide or the fan; and the coupling portion has a width by which the fan is spaced apart from the inner guide.

7. The display device according to claim 1, wherein the outer guide comprises:
a first body having an air suction hole, the first body coupled to the fan, and spaced apart from the inner guide and the low temperature portion in a particular direction; and
a second body extending from the first body to surround an outer circumference of the low temperature portion, wherein the outer circumference of the low temperature portion faces an inner circumference of the second body in a radial direction and is spaced apart from the inner circumference of the second body.

8. The display device according to claim 7, wherein:
the second body is spaced apart from the display panel; and
a shape of the second body gradually expands leading towards the display panel.

9. The display device according to claim 1, further comprising a barrier disposed in a vicinity of the at least one cooler, the barrier configured to surround an outer circumference of the at least one cooler and spaced apart from the at least one cooler.

10. A display device comprising:
a display panel; and
at least one cooler configured to dissipate heat of the display panel,
wherein the display panel comprises:
a case;
a circuit board disposed inside the case and on which at least one heat generation element is installed; and
a back cover configured to protect the circuit board,
wherein the at least one cooler comprises:
a vapor chamber comprising a high temperature portion to be heated by the display panel and a low temperature portion connected to the high temperature portion through a connection portion and spaced apart from the display panel;
a fan spaced apart from the vapor chamber to blow air toward the vapor chamber; and
an air guide configured to guide the air blown from the fan to the low temperature portion, and
wherein a through-hole through which the vapor chamber passes is defined in the back cover.

11. The display device according to claim 10, wherein the air guide comprises:
an inner guide disposed between the fan and the high temperature portion to guide the air blown from the fan to the low temperature portion; and
an outer guide providing passages between the inner guide and the outer guide and between the vapor chamber and the outer guide.

12. The display device according to claim 11, wherein:
the high temperature portion faces one surface of the inner guide; and
the fan faces the other surface of the inner guide.

13. The display device according to claim 11, wherein the outer guide comprises:
a first body having an air suction hole, the first body coupled to the fan, and spaced apart from the inner guide and the low temperature portion in a particular direction; and
a second body extending from the first body to surround an outer circumference of the low temperature portion, wherein the outer circumference of the low temperature portion faces an inner circumference of the second body in a radial direction and is spaced apart from the inner circumference of the second body.

14. The display device according to claim 13, wherein a shape of the second body gradually expands leading towards the back cover.

15. The display device according to claim 13, wherein a gap is defined between a front end of the outer guide and a rear surface of the back cover in the particular direction.

16. The display device according to claim 10, further comprising a barrier disposed in a vicinity of the at least one cooler, the barrier configured to surround an outer circumference of the at least one cooler and spaced apart from the at least one cooler.

17. The display device according to claim 16, wherein the barrier is disposed to surround outer circumferences of a plurality of coolers, and has a closed loop cross-sectional shape.

18. The display device according to claim 16, wherein:
the barrier is disposed to protrude from a rear surface of the back cover; and
the barrier has a predetermined length in a particular direction, the length of the barrier being greater than that of a gap defined between a front end of an outer guide and a rear surface of the display panel in the particular direction.

19. A display device comprising:
a display panel; and
at least one cooler configured to dissipate heat of the display panel,
wherein the at least one cooler comprises:
a vapor chamber comprising a high temperature portion to be heated by the display panel and a low temperature portion connected to the high temperature portion through a connection portion and spaced apart from the display panel;
a fan spaced apart from the vapor chamber to blow air toward the vapor chamber; and
an air guide configured to guide the air blown from the fan to the low temperature portion,
wherein the air guide comprises:
an inner guide disposed between the fan and the high temperature portion to guide the air blown from the fan to the low temperature portion; and
an outer guide providing passages between the inner guide and the outer guide and between the vapor chamber and the outer guide,
wherein an inner guide coupling portion configured to couple the inner guide to the high temperature portion is disposed on each of the high temperature portion and the inner guide, and
wherein the inner guide coupling portion has a width by which the inner guide is spaced apart from the high temperature portion.

20. A display device comprising:
a display panel; and
at least one cooler configured to dissipate heat of the display panel,
wherein the at least one cooler comprises:
a vapor chamber comprising a high temperature portion to be heated by the display panel and a low temperature portion connected to the high temperature portion through a connection portion and spaced apart from the display panel;
a fan spaced apart from the vapor chamber to blow air toward the vapor chamber; and
an air guide configured to guide the air blown from the fan to the low temperature portion, wherein the air guide comprises:

an inner guide disposed between the fan and the high temperature portion to guide the air blown from the fan to the low temperature portion; and an outer guide providing passages between the inner guide and the outer guide and between the vapor chamber and the outer guide, wherein a coupling portion configured to couple the fan to the inner guide is disposed on at least one of the inner guide or the fan, and wherein the coupling portion has a width by which the fan is spaced apart from the inner guide.

21. A display device comprising:

a display panel; and at least one cooler configured to dissipate heat of the display panel, wherein the at least one cooler comprises:

a vapor chamber comprising a high temperature portion to be heated by the display panel and a low temperature portion connected to the high temperature portion through a connection portion and spaced apart from the display panel;

a fan spaced apart from the vapor chamber to blow air toward the vapor chamber; and an air guide configured to guide the air blown from the fan to the low temperature portion, wherein the air guide comprises:

an inner guide disposed between the fan and the high temperature portion to guide the air blown from the fan to the low temperature portion; and an outer guide providing passages between the inner guide and the outer guide and between the vapor chamber and the outer guide, wherein the outer guide comprises:

a first body having an air suction hole, the first body coupled to the fan, and spaced apart from the inner guide and the low temperature portion in a particular direction; and a second body extending from the first body to surround an outer circumference of the low temperature portion, and wherein the outer circumference of the low temperature portion faces an inner circumference of the second body in a radial direction and is spaced apart from the inner circumference of the second body.

22. A display device comprising:

a display panel; and at least one cooler configured to dissipate heat of the display panel, wherein the at least one cooler comprises:

a vapor chamber comprising a high temperature portion to be heated by the display panel and a low temperature portion connected to the high temperature portion through a connection portion and spaced apart from the display panel;

a fan spaced apart from the vapor chamber to blow air toward the vapor chamber; and an air guide configured to guide the air blown from the fan to the low temperature portion, and wherein the display device further comprises a barrier disposed in a vicinity of the at least one cooler, the barrier configured to surround an outer circumference of the at least one cooler and spaced apart from the at least one cooler.

* * * * *